United States Patent
Eberler et al.

(10) Patent No.: US 6,825,665 B2
(45) Date of Patent: Nov. 30, 2004

(54) MAGNETIC RESONANCE TOMOGRAPHY APPARATUS WITH VACUUM CAST OR VACUUM DIE CAST BODY COIL

(75) Inventors: Ludwig Eberler, Postbauer-Heng (DE); Michael Eberler, Postbauer-Heng (DE); Thomas Kolbeck, Kalchreuth (DE)

(73) Assignee: Siemens Aktiengesellschaft, Münich (DE)

(*) Notice: Subject to any disclaimer, the term of this patent is extended or adjusted under 35 U.S.C. 154(b) by 0 days.

(21) Appl. No.: 10/428,228

(22) Filed: May 2, 2003

(65) Prior Publication Data

US 2004/0021467 A1 Feb. 5, 2004

(30) Foreign Application Priority Data

May 2, 2002 (DE) .......................................... 102 19 767

(51) Int. Cl.[7] ................................................. G01V 3/00
(52) U.S. Cl. ...................................... 324/318; 324/322
(58) Field of Search ................................. 324/318, 322, 324/306, 309, 300, 312, 314

(56) References Cited

U.S. PATENT DOCUMENTS

| | | | |
|---|---|---|---|
| 5,235,283 A | * | 8/1993 | Lehne et al. ................. 324/318 |
| 5,304,932 A | | 4/1994 | Carlson |
| 5,374,890 A | | 12/1994 | Zou et al. |
| 5,841,279 A | | 11/1998 | Hayashi et al. |
| 5,990,681 A | | 11/1999 | Richard et al. |
| 6,084,409 A | * | 7/2000 | Zebelein et al. ............ 324/318 |

FOREIGN PATENT DOCUMENTS

| | | |
|---|---|---|
| DE | 197 22 211 | 8/1998 |
| DE | 198 36 588 | 2/2000 |
| DE | 198 38 390 | 3/2000 |

* cited by examiner

*Primary Examiner*—Louis Arana
(74) *Attorney, Agent, or Firm*—Schiff Hardin LLP

(57) ABSTRACT

A magnetic resonance tomography apparatus has a basic field magnet that is surrounded by a magnet envelope. This basic field magnet surrounds and limits an interior space with a gradient coil system disposed in this interior space and a body coil having an RF antenna and a carrying tube disposed in said gradient coil system as an inner encapsulation cylinder. The magnet envelope and the gradient coil system are both optically as well as acoustically closed by the body coil and a cladding at the end faces and in the interior. The body coil is manufactured by a vacuum casting or vacuum die-casting process.

14 Claims, 6 Drawing Sheets

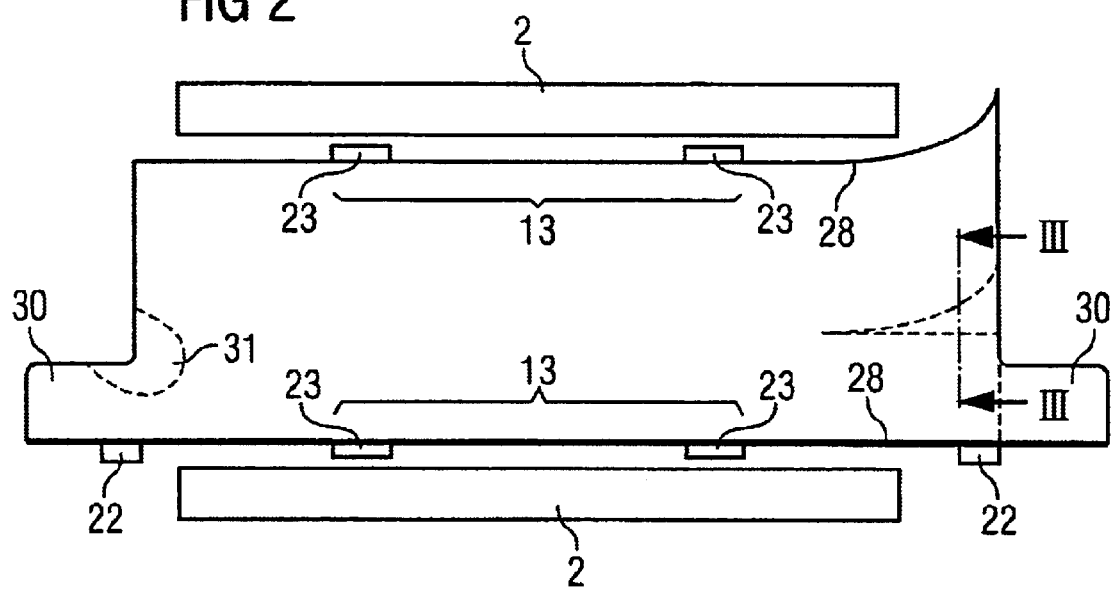
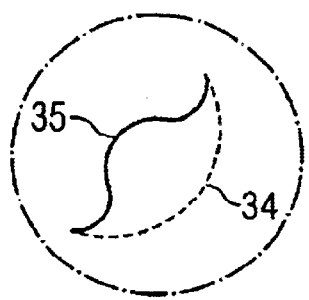

FIG 8
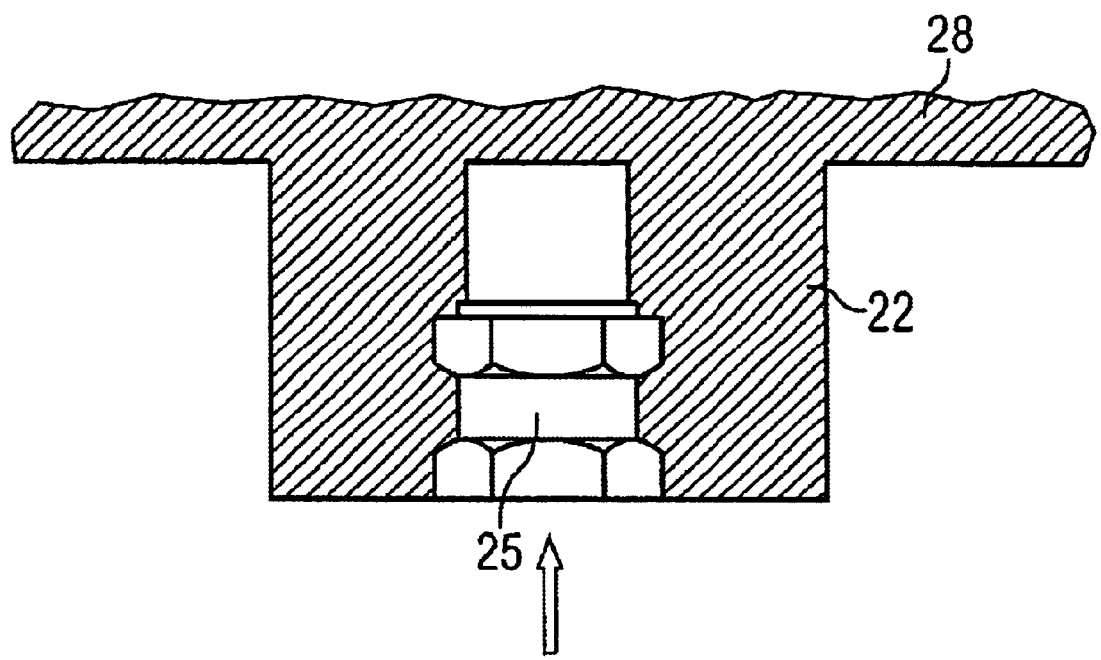
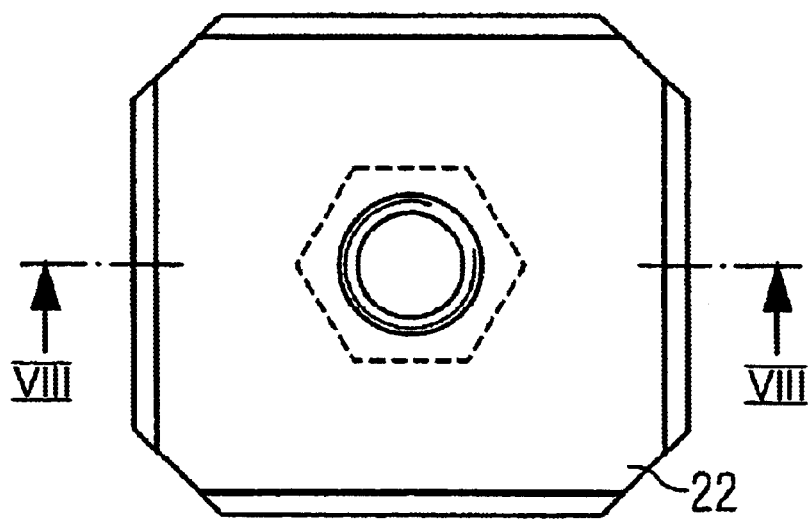
FIG 7

MAGNETIC RESONANCE TOMOGRAPHY APPARATUS WITH VACUUM CAST OR VACUUM DIE CAST BODY COIL

BACKGROUND OF THE INVENTION

1. Field of the Invention

The present invention is directed in general to magnetic resonance tomography as employed in medicine for examining patients. The present invention is specifically directed to a method for manufacturing a carrier tube for the body coil of an MRI apparatus.

2. Description of the Prior Art

MRT is based on the physical phenomenon of nuclear magnetic resonance and has been successfully utilized as an imaging method in medicine and in biophysics for more than 15 years. In this examination modality, the subject is disposed in a strong, constant magnetic field. The nuclear spins of the atoms in the subject that were previously irregularly oriented are aligned as a result. Radio-frequency energy can then excite these "ordered" nuclear spins to a specific oscillation. This oscillation generates the actual measured signal in MRT that is picked up with suitable reception coils. The examination subject can be spatially encoded in all three spatial directions by utilizing non-uniform magnetic fields generated by gradient coils. The method allows a free selection of the slice to be images, allowing tomograms of the human body to be acquired in all directions. As a tomographic imaging method in medical diagnostics, MRT is distinguished first and foremost by a versatile contrast capability as a "non-invasive" examination modality. MRT currently employs applications with high gradient power that enable an excellent image quality with measuring times on the order of magnitude of seconds and minutes.

The constant technological improvement of the components of MRT devices and the introduction of fast imaging sequences have created an increasing number of medical application in medicine. Real-time imaging for supporting minimally invasive surgery, functional imaging in neurology and perfusion measurement in cardiology are a few examples.

FIG. 9 shows a schematic section through a conventional MRT apparatus. The section shows further components of the interior that is surrounded by the basic field magnet 1. The basic field magnet 1 contains superconducting magnet coils that are situated in liquid helium and is surrounded by a magnet envelope 12 in the form of a two-shell vessel. The cryo-head 15 that is attached to the magnet envelope 12 at the outside is responsible for keeping the temperature constant. The gradient coil 2 is concentrically suspended via carrying elements 7 in the interior surrounded by the magnet envelope 12 (also called magnet vessel). A carrying tube with the radio-frequency antenna applied thereon is likewise concentrically introduced in the interior of the gradient coil 2. The carrying tube and RF antenna are referred to below as an RF resonator or as a "body coil" 13. The gradient coil 2 and the body coil 13 thus represent two cylinders inserted into one another with a radial spacing therebetween—in the form of an air gap—amounting only to about 3 cm. The RF antenna converts RF pulses emitted by a power transmitter into a magnetic alternating field for exciting the atomic nuclei of the patient 18, and subsequently converts the alternating field emanating from the precessing nuclear moment into a voltage supplied to the reception branch. The upper part of the body coil 13 is mechanically connected to the magnet envelope 12 via a cladding 29 that is funnel-shaped. Tongues 30 (see FIG. 10) are mounted at the lower part of the body coil 13, the body coil 13 being mechanically connected via these tongues 30 to the lower part of the magnet envelope 12 via a cladding 29 as well as with carrying elements 7. The tongues 30 as well as the body coil 13 are mechanically connected to bed rails 33. Under certain circumstances, the tongues 30 are considered as belonging to the body coil 13. The patient 18 on a patient bed 19 is moved into the opening in the interior of the system via glide rails 17. The patient bed is disposed on a vertically adjustable carrying frame 16.

The gradient coil 2 is likewise composed of a carrying tube 6 having an exterior on which three windings (coils) are disposed that each generate a gradient that is proportional to the current supplied to the coil. The three gradients are perpendicular to one another. A radio-frequency shield (RF shield) 20 that shields the coils from the radio-frequency field of the RF antenna is applied on the inside of the carrying tube 6. As shown in FIG. 11, the gradient coil 2 has an x-coil 3, a y-coil 4 and a z-coil 5 that are respectively wound around the carrying tube 6 and thus respectively generate gradient fields in the directions of the Cartesian coordinates x, y and z. Each of these coils is equipped with its own power supply in order to generate independent current pulses with the correct amplitude and at the correct time in conformity with the sequence programmed in the pulse sequence controller. The required currents lie at approximately 250 A. Since the gradient switching times should be as short as possible, current rise rates on the order of magnitude of 250 kA/s are required. In an extremely strong magnetic field as is generated by the basic field magnet 1 (typically between 0.22 and 1.5 Tesla), such switching events involve strong mechanical oscillations due to the Lorentz forces that thereby occur, these mechanical oscillations leading to considerable noise.

The following demands are made of the body coil 13 of an MRT apparatus:

For space reasons, a tube wall thickness of only up to 10 mm can be accepted. The material of the body coil should comprise an optimally low power absorption of RF power, i.e. must be electrically non-conductive. The body coil must be MR-compatible, i.e. non-imaging in the sense of magnetic resonance (for example, it dare not contain any water). Since the body coil is supposed to carry the patient bed with patient, the body coil must comprise high mechanical shape stability. In order to shield the noise generated mainly by the gradient coil as well as possible, to body coil should be optimally long without comprising interruptions. For design-oriented reasons, however, the funnel-shaped widened portion (cladding 29) of the patient tunnel should also begin as far inside as possible, which leads to a very short body coil and does not meet the noise-related demands.

In conventional solutions, short cylindrical Gfk tubes of epoxy resin are employed for the body coil, the functional elements of the RF antenna being applied thereon in the form of planar copper conductors. For manufacturing such tubes, a rotating arbor is wrapped with resin-saturated fiberglass rovings and is cured (possibly upon application of heat). This solution involves compromises that have a significant disadvantage with respect to one of the two aspects of noise or design: Although the body coil is short, the funnel-shaped widened portion is not a part of the body coil but is composed of a separate plastic part (cladding 29). This is inadequate for meeting the noise-reducing demands since it lacks the necessary mass and rigidity. Second, the interface between the body coil and the funnel-shaped cladding represents an acoustic weak point.

SUMMARY OF THE INVENTION

It is an object of the present invention to optimize the noise and design properties as well as the electromechanical stability of a magnetic resonance tomography apparatus.

This object is inventively achieved in a magnetic resonance tomography apparatus having a basic field magnet surrounded by a magnet envelope that surrounds and limits an interior space, with a gradient coil system disposed in this interior space, and a body coil having an RF antenna and a carrying tube disposed in the gradient coil system as an inner encapsulation cylinder, and wherein the magnet envelope and the gradient coil system are optically as well as acoustically closed by the body coil and a diaphragm at the end faces and in the interior. The body coil is inventively manufactured by a vacuum casting process or a vacuum die-casting process.

A body coil manufactured in this way yields a great number of advantages.

First, the casting technique allows significantly more degrees of freedom as to the shaping.

In order to meet optimum noise-related requirements, for example, the body coil can be cast such that has an overall length that is greater than the gradient coil lying behind it.

In order to also meet optimum design requirements, the body coil can be cast such that it is widened with a funnel-shape at one end or at both end faces. This is possible only to a limited extent and with considerable outlay given the conventionally employed winding technique.

When tongues and/or bed rails are provided in the lower region of the body coil, these can be inventively cast with the body coil to form a unit, which leads to a considerably better overall mechanical stability.

Functional elements, which are conventionally glued onto the wound body coil, can likewise be cast with the body coil to form a stable unit as a result of manufacturing the body coil with vacuum casting or vacuum die-casting methods.

The functioning of the RF antenna or the shielding thereof with the RF shield can be greatly improved by manufacturing the body coil with vacuum casting or vacuum die-casting methods because functional elements of the RF antenna of the body coil can be cast with the body coil on an arbitrary radius. Capacitances of the RF antenna likewise can be cast in as fixed components or overlapping structures and thus are optimally protected against external arcing or other disturbing effects.

Cooling elements also can be cast into the body coil by manufacturing the body coil with vacuum casting or vacuum die-casting methods, these cooling elements having a far greater efficiency than cooling elements that are applied onto the surface of the body coil.

Material having a low dielectric constant can be locally introduced into the mold in carrying tube regions with a high electrical field intensity when manufacturing the body coil with vacuum casting or vacuum die-casting methods and can be subsequently cast with the tube. As a result dielectric losses are kept small and the capacitive coupling of the RF field to the patient is improved.

Mechanically weak regions of the surface of the body coil can be reinforced by introducing a reinforcement into the mold before the casting.

Rovings and/or woven mats and/or pre-pregs are inventively employed for reinforcement.

The casting material can be suitably optimized by adding fillers.

DESCRIPTION OF THE DRAWINGS

FIG. 2 is a more detailed schematic section through the body coil constructed in accordance with the invention, engaged in the gradient coil.

FIG. 3 is a section taken along line III—III of FIG. 2, illustrating the contour that can be achieved on the body coil constructed in accordance with the present invention, compared to a conventional contour.

FIG. 7 is a plan view of a body coil and a support therefor constructed in accordance with the present invention.

FIG. 8 is a section taken along line VIII—VIII of FIG. 7.

DESCRIPTION OF THE PREFERRED EMBODIMENTS

Figure 1:
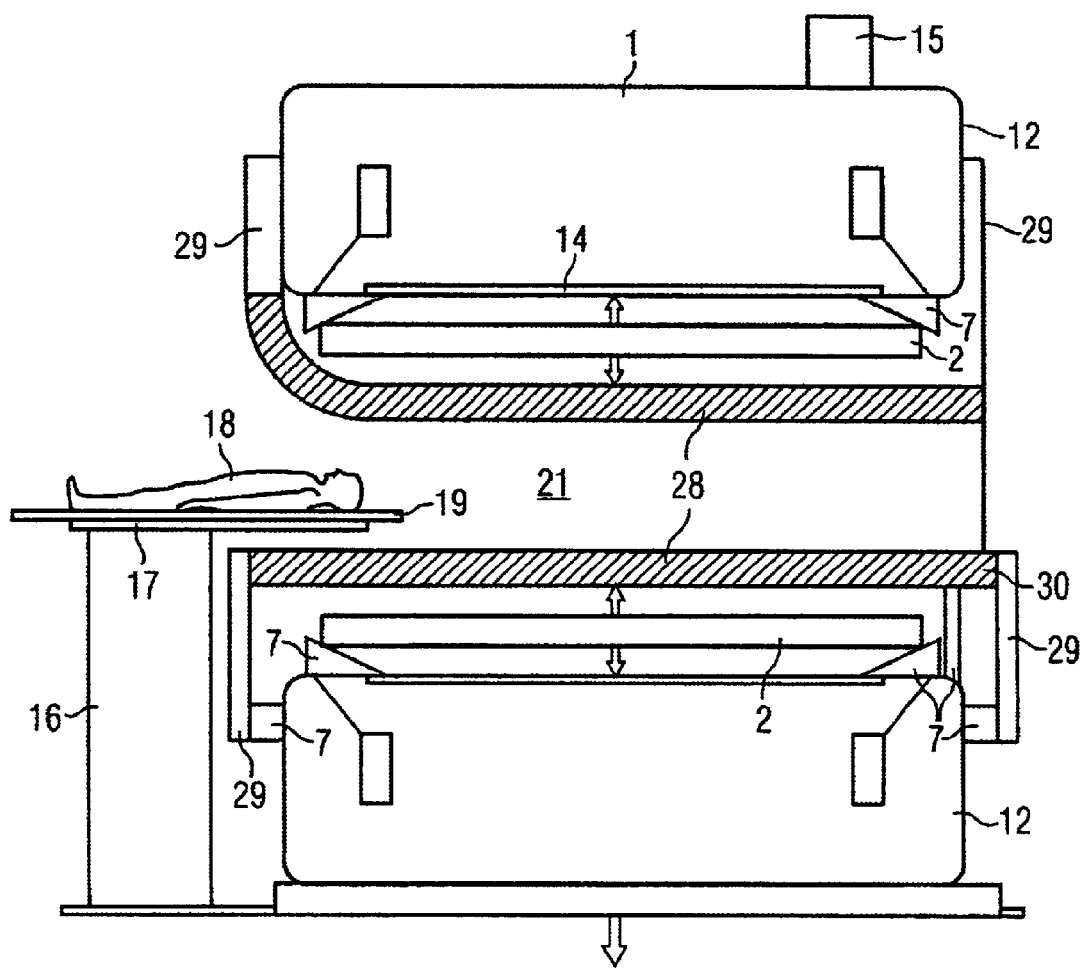
FIG. 1 schematically illustrates a section through a magnetic resonance tomography (MRT) apparatus having a body coil constructed in accordance with the principles of the present invention.

FIG. 1 is a schematic section through an MRT apparatus having a body coil 28 that was inventively manufactured with vacuum casting or vacuum die-casting technology. The manufacturing technology allows a lengthening of the body coil 28 beyond the gradient coil lying behind it while allowing a one-sided funnel-shaped widening of the upper part. The tongues 30 with the stabilizing bed rails 33 are likewise cast into the body coil 28. The cladding 29 in the upper part of the MRT apparatus is correspondingly shortened. All further components of the MRT apparatus as already described in connection with FIG. 5 remain unmodified.

FIG. 2 shows a detailed schematic section through the inventive body coil 28 engaged into the gradient coil 2. Mechanical weak points 31 are reinforced by introducing mechanically stabilizing elements into the corresponding regions of the mold. Stabilizing, all around stiffeners 23 and bearings 22, which were glued or otherwise applied on the body coil 13 after the winding of the body coil 13 according to conventional technology, are firmly cast with the body coil 23 by means of vacuum casting or vacuum die-casting technology.

FIG. 3 is a sectional view taken along line III—III of FIG. 2 showing, with the solid line 35, the shape of the exterior contour that can be obtained by manufacturing the body coil 28 by means of vacuum casting or vacuum die-casting. Virtually any desired contour can be obtained, in contrast to the conventional contour 34, indicated in FIG. 3 with a dashed line, which was dictated, and could not be deviated from, by the conventional winding technique used to manufacture the conventional body coil 13.

Figure 5:
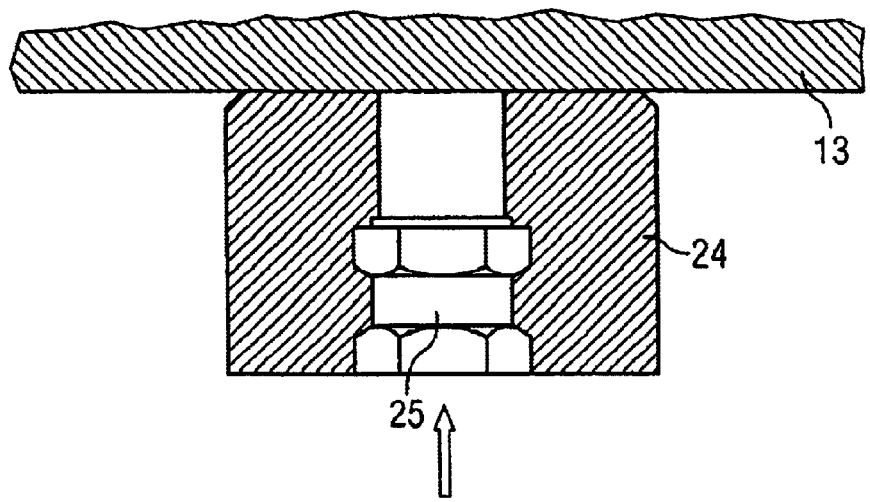
FIG. 5 is a section taken along line V—V of FIG. 4, showing the conventional attachment of the body coil to the support.
Figure 4:
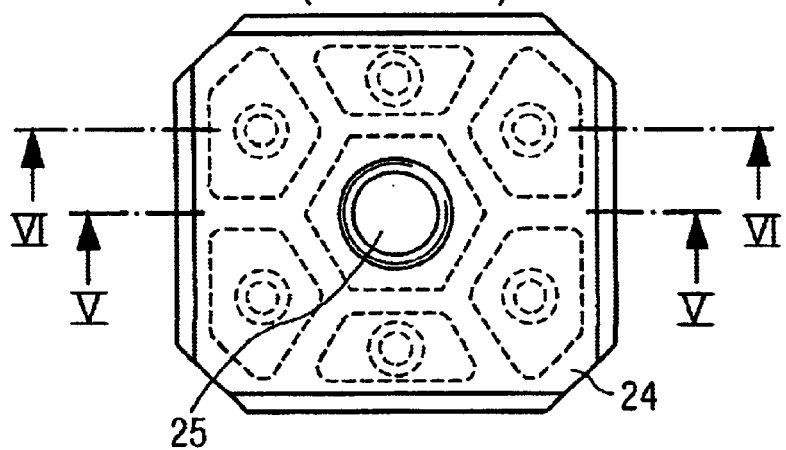
FIG. 4 is a plan view of a conventional body coil and support therefor.
Figure 6:
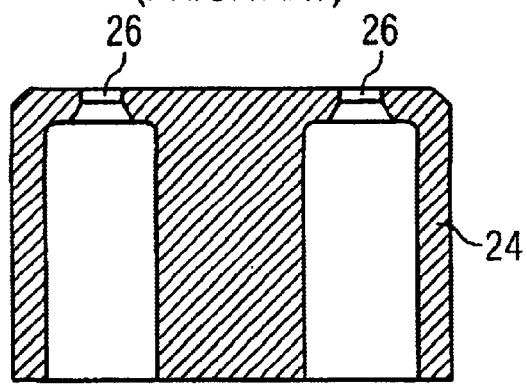
FIG. 6 is a section taken along line VI—VI of FIG. 4, showing the interior structure of a conventional support for the body coil.

Differences between the conventional wound technique and the inventive vacuum or vacuum die-casting technology are further illustrated on the basis of FIGS. 4–6, which represent a conventional support element for the RF resonator (body coil) 13, and FIGS. 7 and 8 which represent a component made according to the invention.

FIG. 4 is a plan view of a mechanical component 24. Conventionally, this is an injection-molded part that serves the purpose of supporting or suspending the RF resonator 13. To this end, a brass bushing with an interior thread 25 is centrally cast in the component 24. According to the conventional method as shown in FIG. 5, which is a section along line V—V in FIG. 5, the injection-molded part 24 is glued to the RF resonator 13. In order to create a better connection between injection molded part 24 and RF resonator 13, undercuts 27 that have smaller diameters 26 at the side adjacent the RF resonator 13, are concentrically provided around the bushing 25. These are shown in section in FIG. 6, which is taken along line VI—VI on FIG. 5. During gluing, the adhesive penetrates through the smaller openings 26 and fills a part of the larger-volume undercuts 27, resulting in a kind of "solder flow effect" after the drying of the adhesive that sets a firmer connection between the injection molded part 24 and the RF resonator 13 than would be the case given a purely planar connection between the two parts.

Figure 9:
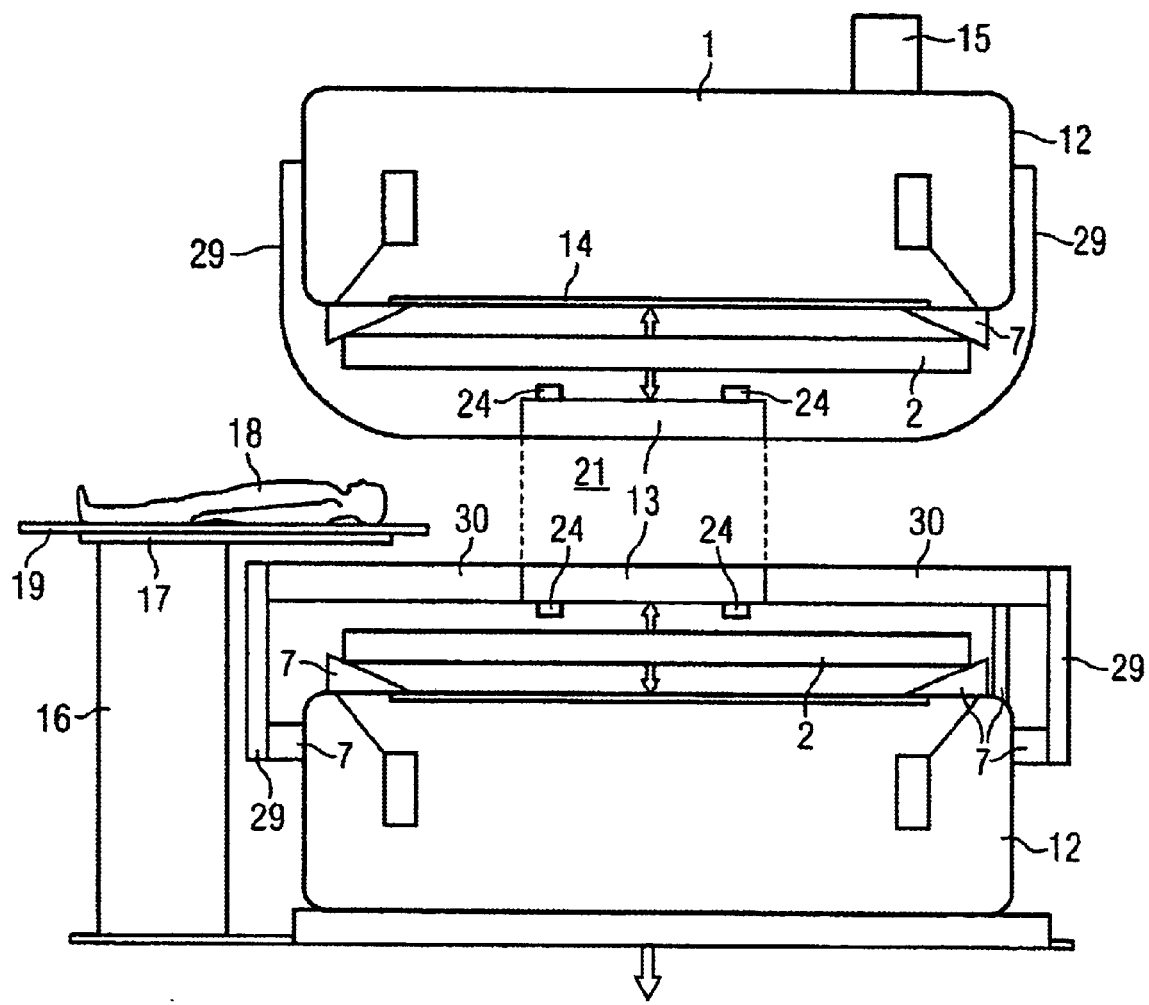
FIG. 9 schematically illustrates a section through a magnetic resonance tomography apparatus having a conventionally constructed body coil.
Figure 10:
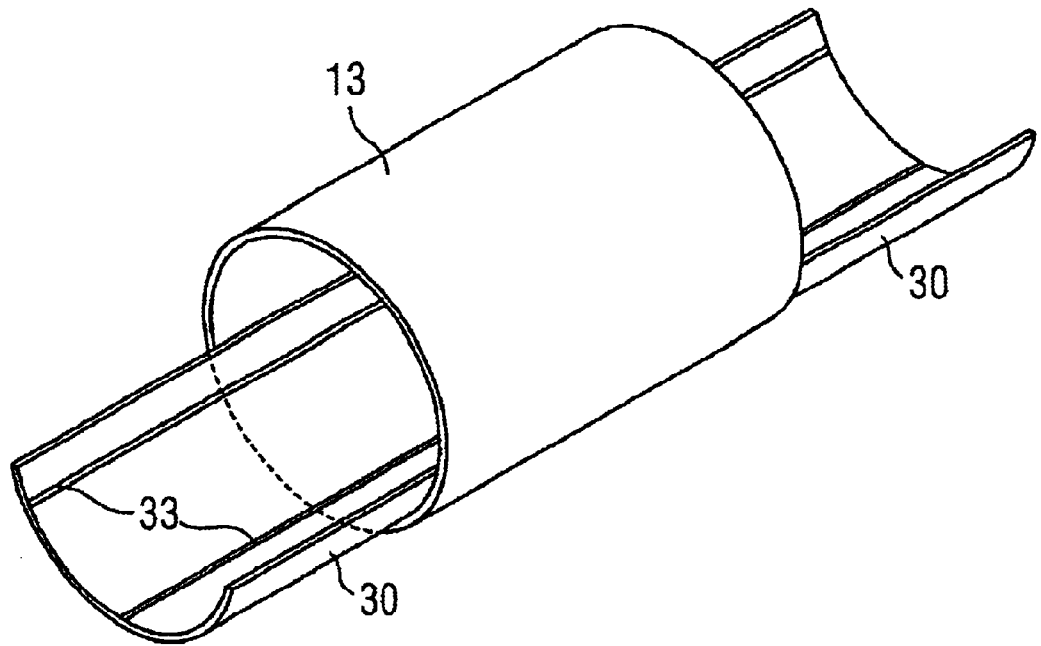
FIG. 10 is a perspective view of a conventionally constructed body coil with tongues attached thereto.
Figure 11:
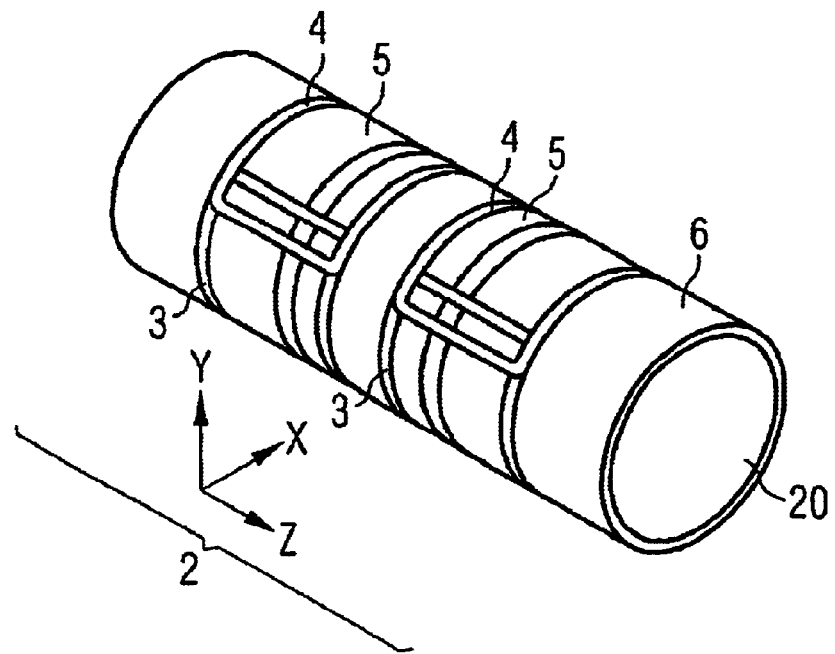
FIG. 11 is a perspective view of a conventional gradient coil having three gradient windings, and an RF shielding coil.

Such undercuts 26, 27 are no longer needed in the MR apparatus manufactured a method according to the present invention (FIG. 7) since a gluing is also no longer required. The support 22 is created in the mold and the threaded bushing 25 is secured to the mold with fixing aids (for example, screws). After casting, the support 22 with the threaded bushing 25 therein is a fixed component of the body coil 28 and forms a compact unit together with it (FIG. 9, which is a section along line VIII—VIII of FIG. 7).

In accordance with the present invention the body coil is manufactured with a vacuum casting or vacuum die-casting technology. Epoxy resin as well as other resins or other castable materials can be employed as the casting material. The casting properties of the particular material that is used can be optimized by adding fillers (for example, quartz powder). The mechanical strength can be increased by introducing rovings and/or woven mats and/or pre-pregs (pre-impregnated materials) into the mold. Pre-pregs are pre-treated (with resin), woven fiberglass, aramid or carbon fiber mats that are cured under high temperature after the desired shaping or, respectively, positioning.

As mold is inventively employed that is composed of an arbor at the inside and a casing at the outside. The two end faces are closed by flanges. Functional elements (to be described in detail below) are introduced into the mold with fixing aids (for example, of Gfk material) and are placed at the desired location or integrated into the arbor or casing from the very outset.

When a vacuum casting technology is employed, the mold is evacuated before the casting. An overflow reservoir is located at the highest point of the mold. Given, for example, a vertically placed mold, the evacuation ensues at the lower flange, and the upper flange contains the overflow reservoir. The upper side can alternatively be open if it has a planar upper edge. In this case, a flange with an overflow reservoir is not necessary. A closed upper side with an overflow reservoir, however, allows an arbitrary, non-planar terminating edge to be formed. For example, such a non-planar edge is needed when tongues 30 are also to be integrated into the body coil 28 (see FIG. 1) in the casting process.

This inventive manufacturing of the body coil of an MRT apparatus yields a number of advantages, which are as follows.

In contrast to the conventional winding technique, the casting technique makes it possible to lengthen the body coil beyond the gradient coil and to design the extension with a funnel-like widening. It is also likewise possible to accept the tongues 30 into the mold of the body coil 28, even at both sides under certain circumstances. Such a modified body coil 28 is shown hatched in FIG. 1. The funnel-shaped widening at the one end and in the upper region of the body coil satisfies the aforementioned design demands. The overall length projects beyond both end faces of the gradient coil and insures a best-possible noise shielding. The tongues 30 that accept the patient bed 19 are correspondingly shortened and are an integral component of the body coil 13.

The casting technique allows significantly more degrees of freedom in the shaping. In contrast to the conventional wound tube, exactly identical wall thicknesses are obtained (when desired) without requiring mechanical post-processing. Moreover, deviations from windable shapes are possible such as, for example, variable outside diameters, arbitrary outside contours (see FIG. 3) or (funnel-shaped) widened portions of the diameter (see the front region of the body coil 13 in FIGS. 1 and 2). Local weak points 31 can be reinforced in a simple way by strengthening the wall thickness (for example, with reinforcing fibers by means of rovings, woven mats or pre-pregs). The mechanical properties of the corresponding weak point 31 (for example, sagging under load) can be significantly improved by an optimum alignment of the reinforcing fibers as well as by selecting the appropriate mesh width without being restricted to a specific winding angle.

As a result of the vacuum casting or vacuum die-casting technique, functional elements (mechanical components such as bushings) of the tube, or in the antenna (copper strips or rods, PC boards with conductive structures, etc.) can be introduced in defined fashion on an arbitrary radius within the wall. Particularly given application of the RF antenna onto the surface of the tube, the subsequent gluing as is currently implemented is eliminated. Since the properties of the antenna can be highly dependent on, among other things, the radial spacing from the patient as well as from the surrounding RF shield, an optimization in terms of the emission and shielding of the RF field can ensue by means of suitable placement of the antenna within the body coil 28.

Capacitances of the RF antenna can be cast as fixed components (for example, discrete capacitors) or overlapping structures (of, for example, copper) and are thus optimally protected against external arcing or other disturbing effects (such as, for example, corona discharges).

Under certain circumstances, it is meaningful or necessary to design the electrical properties of the body coil 28 differently in regions thereof. For example, dielectric losses can be kept low or the capacitive coupling of the RF field to the patient can be improved by locally introducing material having a low dielectric constant (for example, hard foam with large closed pores) into the regions that experience high electrical fields. Such a procedure can be implemented in a simple way with the inventive manufacturing method without weakening the (outer) layers that are important for the mechanical properties.

Cooling elements can be integrated in a simple way with the vacuum or vacuum die-casting technique. Thus, for example, plastic conduits for air cooling or cooling conduits for cooling with MR-neutral liquids as well as copper tubes for water cooling can be cast in a simple way. Integrated cooling elements have a far higher efficiency than cooling elements that are applied onto the outer surface of the body coil 28, also is currently done.

The vacuum or vacuum die-casting technique also enables the integration of further function elements such as bed rails 33, appliques 23, fastening or, support elements 22, etc. Such components were hitherto glued onto the body coil. Compared to gluing, casting these components into the cast part simplifies the manufacturing and assembly process and increases the mechanical strength. To this end, the components are secured to the casing or arbor with adhesive tape or screwed connections during the setup. It is likewise also possible to incorporate the corresponding components into the mold topology (casing or arbor).

The vacuum or vacuum die-casting technique for manufacturing the body coil 28 ultimately leads to an inventively modified MRT apparatus as shown in FIG. 1. A noise reduction is achieved by means of such an inventive redesign of the body coil 28. Overall, the manufacturing and assembly process is simplified taking the acoustic and design boundary conditions into consideration.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance tomography apparatus comprising:
   a basic field magnet surrounded by a magnet envelope, surrounding and limiting an interior space, said interior space having a longitudinal axis proceeding therethrough;
   a gradient coil system disposed in said interior space;
   a body coil, comprising a radio-frequency antenna disposed on a carrying tube, disposed inside said gradient coil system and defining an inner surface of said interior space, said magnet envelope and said gradient coil system being optically and acoustically closed by said body coil and a cladding; and
   said body coil consisting of a cast part produced by a casting process selected from the group consisting of vacuum casting and vacuum die-casting, said body coil having a length along said longitudinal axis that is larger than a length of said gradient coil system along said longitudinal axis.

2. A magnetic resonance tomography apparatus as claimed in claim 1 wherein said cast part has a lower region and includes bed rails at said lower region, adapted to receive a patient bed.

3. A magnetic resonance tomography apparatus as claimed in claim 1 wherein said cast part includes at least one functional element associated with said radio-frequency antenna.

4. A magnetic resonance tomography apparatus as claimed in claim 3 wherein said at least one functional element has an arbitrarily selected radius in an interior of said body coil.

5. A magnetic resonance tomography apparatus as claimed in claim 1 wherein said cast part includes cast-in cooling elements.

6. A magnetic resonance tomography apparatus as claimed in claim 1 wherein said cast part is formed of casting material having characteristics optimized by added fillers.

7. A magnetic resonance tomography apparatus comprising:
   a basic field magnet surrounded by a magnet envelope, surrounding and limiting an interior space having a longitudinal axis proceeding therethrough;
   a gradient coil system disposed in said interior space;
   a body coil, comprising a radio-frequency antenna disposed on a carrying tube, disposed inside said gradient coil system and defining an inner surface of said interior space, said magnet envelope and said gradient coil system being optically and acoustically closed by said body coil and a cladding; and
   said body coil consisting of a cast part produced by a casting process selected from the group consisting of vacuum casting and vacuum die-casting, said body coil having opposite ends disposed along said longitudinal axis, and said cast part having a funnel-shaped widening at at least one of said ends.

8. A magnetic resonance tomography apparatus comprising:
   a basic field magnet surrounded by a magnet envelope, surrounding and limiting an interior space;
   a gradient coil system disposed in said interior space;
   a body coil, comprising a radio-frequency antenna disposed on a carrying tube, disposed inside said gradient coil system and defining an inner surface of said interior space, said magnet envelope and said gradient coil system being optically and acoustically closed by said body coil and a cladding; and
   said body coil consisting of a cast part produced by a casting process selected from the group consisting of vacuum casting and vacuum die-casting, said cast part having a lower region, and tongues projecting from said carrying tube at said lower region.

9. A magnetic resonance tomography apparatus comprising:
   a basic field magnet surrounded by a magnet envelope, surrounding and limiting an interior space;
   a gradient coil system disposed in said interior space;
   a body coil, comprising a radio-frequency antenna disposed on a carrying tube, disposed inside said gradient coil system and defining an inner surface of said interior space, said magnet envelope and said gradient coil system being optically and acoustically closed by said body coil and a cladding; and
   said body coil consisting of a cast part produced by a casting process selected from the group consisting of vacuum casting and vacuum die-casting, said cast part being formed of casting material and including material having a low dielectric constant introduced into said casting material at local regions experiencing a high electrical field intensity during operation of said magnetic resonance tomography apparatus.

10. A magnetic resonance tomography apparatus comprising:
    a basic field magnet surrounded by a magnet envelope, surrounding and limiting an interior space;
    a gradient coil system disposed in said interior space;
    a body coil, comprising a radio-frequency antenna disposed on a carrying tube, disposed inside said gradient coil system and defining an inner surface of said interior space, said magnet envelope and said gradient coil system being optically and acoustically closed by said body coil and a cladding; and said body coil consisting of a cast part produced by a casting process selected from the group consisting of vacuum casting and vacuum die-casting, said cast part including reinforcements disposed locally at respective mechanically weak regions of a surface of said body coil.

11. A magnetic resonance tomography apparatus as claimed in claim 10 wherein said cast part is cast in a mold and wherein said reinforcement is introduced into said mold before casting said cast part.

12. A magnetic resonance tomography apparatus as claimed in claim 10 wherein said reinforcements are selected from the group consisting of rovings, woven mats and pre-pregs.

13. A magnetic resonance tomography apparatus comprising a basic field magnet surrounded by a magnet envelope, surrounding and limiting an interior space;

a gradient coil system disposed in said interior space;

a body coil, comprising a radio-frequency antenna, said radio-frequency antenna comprising capacitances and being, disposed on a carrying tube, disposed inside said gradient coil system and defining an inner surface of said interior space, said magnet envelope and said gradient coil system being optically and acoustically closed by said body coil and a cladding; and said body coil consisting of a cast part produced by a casting process selected from the group consisting of vacuum casting and vacuum die-casting, said capacitances being cast in said cast part as discrete components.

14. A magnetic resonance tomography apparatus comprising a basic field magnet surrounded by a magnet envelope, surrounding and limiting an interior space;

a gradient coil system disposed in said interior space;

a body coil, comprising a radio-frequency antenna, said radio-frequency antenna comprising capacitances and being disposed on a carrying tube, disposed inside said gradient coil system and defining an inner surface of said interior space, said magnet envelope and said gradient coil system being optically and acoustically closed by said body coil and a cladding; and said body coil consisting of a cast part produced by a casting process selected from the group consisting of vacuum casting and vacuum die-casting, said capacitances being cast in said cast part as overlapping components.

* * * * *